US008987732B2

(12) United States Patent
Chang et al.

(10) Patent No.: US 8,987,732 B2
(45) Date of Patent: Mar. 24, 2015

(54) CERAMIC SEMICONDUCTOR CAPABLE OF INCREASING THE DENSITY OF SURROUNDING SUPEROXIDE IONS AFTER BEING HEATED

(71) Applicants: Chung-Tai Chang, Tainan (TW); Chia-Hao Chang, Tainan (TW)

(72) Inventors: Chung-Tai Chang, Tainan (TW); Chia-Hao Chang, Tainan (TW)

( * ) Notice: Subject to any disclaimer, the term of this patent is extended or adjusted under 35 U.S.C. 154(b) by 64 days.

(21) Appl. No.: 13/987,591

(22) Filed: Aug. 12, 2013

(65) Prior Publication Data

US 2015/0041798 A1 Feb. 12, 2015

(51) Int. Cl.
*H01L 29/12* (2006.01)
*H01L 29/26* (2006.01)

(52) U.S. Cl.
CPC .................................... *H01L 29/26* (2013.01)
USPC ............................................ 257/43; 438/104

(58) Field of Classification Search
USPC ............................................ 257/43; 438/104
See application file for complete search history.

(56) References Cited

U.S. PATENT DOCUMENTS

2009/0194765 A1 * 8/2009 Liau et al. ....................... 257/43

* cited by examiner

*Primary Examiner* — Thien F Tran

(57) ABSTRACT

Disclosed is a ceramic semiconductor capable of increasing the density of surrounding superoxide ions ($O_2^-$) after being heated and passing air. An oxide material capable of enhancing a space charge effect is doped when the ceramic semiconductor is formed, and the ceramic semiconductor has a plurality of through holes, such that after the ceramic semiconductor is electrically conducted to generate current and heat, outer shell electrons of the ceramic semiconductor are separated and remained in the through holes of the ceramic semiconductor and accumulated in the through holes to form an electron cloud. After air passes through the through holes, oxygen in the air collides with an electron and then they combine together to form a superoxide ion ($O_2^-$), so as to increase the density of surrounding superoxide ions ($O_2^-$).

9 Claims, 3 Drawing Sheets

CERAMIC SEMICONDUCTOR CAPABLE OF INCREASING THE DENSITY OF SURROUNDING SUPEROXIDE IONS AFTER BEING HEATED

BACKGROUND OF THE INVENTION

1. Field of the Invention

The present invention relates to a ceramic semiconductor, and more particularly to the ceramic semiconductor capable of increasing the density of surrounding superoxide ions after being heated. An oxide material capable of enhancing a space charge effect is doped when the ceramic semiconductor is formed. The ceramic semiconductor has a plurality of through holes, such that after the ceramic semiconductor is electrically conducted to generate current and heat, outer shell electrons of the ceramic semiconductor are separated and remained in the through holes of the ceramic semiconductor and accumulated in the through holes to form an electron cloud. After air passes through the through holes, oxygen in the air collides with an electron and then they combine together to form a superoxide ion ($O_2^-$), so as to increase the density of surrounding superoxide ions ($O_2^-$). Therefore, the superoxide ion has a very high chemical activity and features the sterilization, cell activation and wound healing functions.

2. Description of the Related Art

The air we breath contains 21% oxygen by volume, and the oxygen exists in a free state of $O_2$(:Ö:Ö:) molecules. The $O_2$(:Ö:Ö:) molecule is formed by two oxygen atoms sharing a pair of electrons, and one of the oxygen atoms has an unpaired electron and thus features a high affinity of electrons. The $O_2$ atom collides with an electron (e) and then they combine together to produce $O_2+e \rightarrow O_2^-$ or $O_2+e \rightarrow O+O^-$ (superoxide ion). The energy required for the deionization/ionization of the superoxide ion is 1.62~22.9 electron volts (ev), so that the superoxide ion has a very high chemical activity and features the sterilization, cell activation and wound healing functions. In addition to R.O.C. Pat. No. I337507 entitled "PTC heat generator structure", U.S. Pat. No. 7,880,581B2 entitled "PTC thermistor" and PRC Pat. No. CN ZL200810167013.2 entitled "PTC heat generator assembly" granted to the inventor of the present invention, the inventor of the present invention further based on the aforementioned effects of the superoxide ion and make use of the feature of generating heat from the PTC heat generator (which is a ceramic semiconductor) after being electrically conducted to develop the ceramic semiconductor capable of not only generating heat, but also producing superoxide ions.

SUMMARY OF THE INVENTION

Therefore, it is a primary objective of the present invention to provide a ceramic semiconductor capable of increasing the density of surrounding superoxide ions.

To achieve the aforementioned objective, the present invention provides a ceramic semiconductor capable of increasing the density of surrounding superoxide ions, wherein an oxide material capable of enhancing a space charge effect is doped when the ceramic semiconductor is formed, and the ceramic semiconductor has a plurality of through holes, such that after the ceramic semiconductor is electrically conducted to generate current and heat, outer shell electrons of the ceramic semiconductor are separated and remained in the through holes of the ceramic semiconductor and accumulated in the through holes to form an electron cloud. After air passes through the through holes; oxygen in the air collides with an electron and then they combine together to form a superoxide ion, so as to increase the density of surrounding superoxide ions.

DETAILED DESCRIPTION OF THE PREFERRED EMBODIMENTS

The technical characteristics, contents, advantages and effects of the present invention will be apparent with the detailed description of a preferred embodiment accompanied with related drawings as follows.

Figure 1:
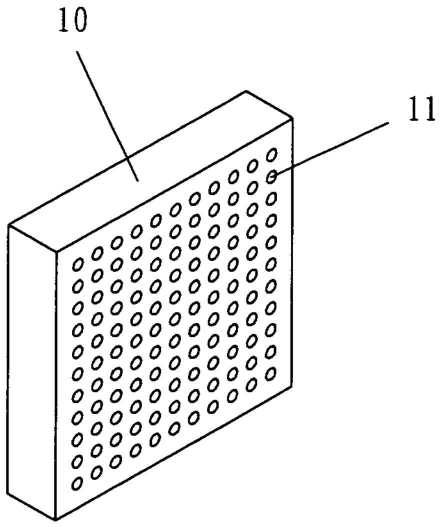
FIG. 1 is a perspective view of a ceramic semiconductor of a preferred embodiment of the present invention.
Figure 2:
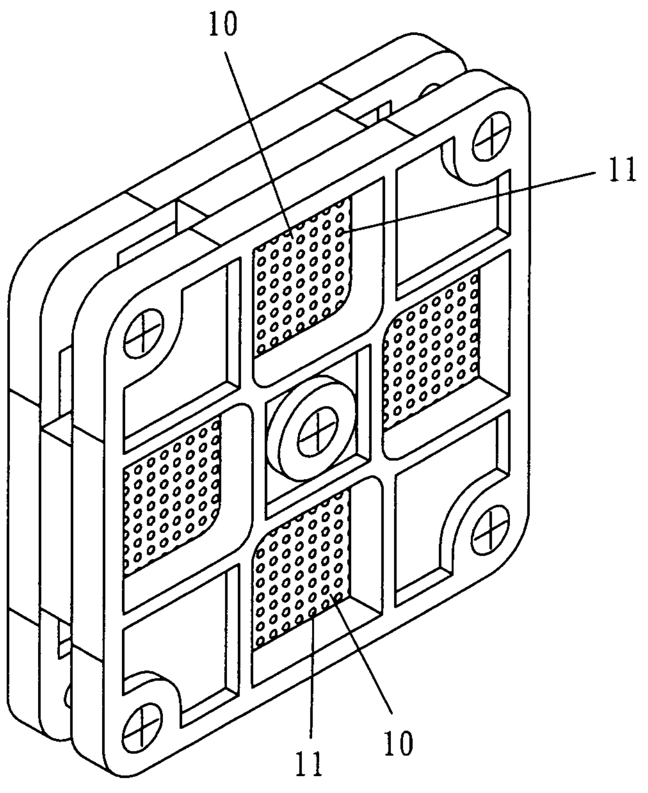
FIG. 2 is a perspective view of a plurality of ceramic semiconductors of a preferred embodiment of the present invention.

In FIGS. 1 and 2, an oxide material such as titanium dioxide ($TiO_2$), zinc oxide (ZnO), tungsten trioxide ($WO_3$), ferric oxide ($Fe_2O_3$), strontium titanate ($SrTiO_3$) capable of enhancing space charge effect is doped when the ceramic semiconductor 10 is formed, and the oxide material can move electrons of the outermost shell easily. The ceramic semiconductor 10 has a plurality of through holes 11, and each through hole 11 has a diameter Φ preferably 1 mm~2 mm.

Figure 3:
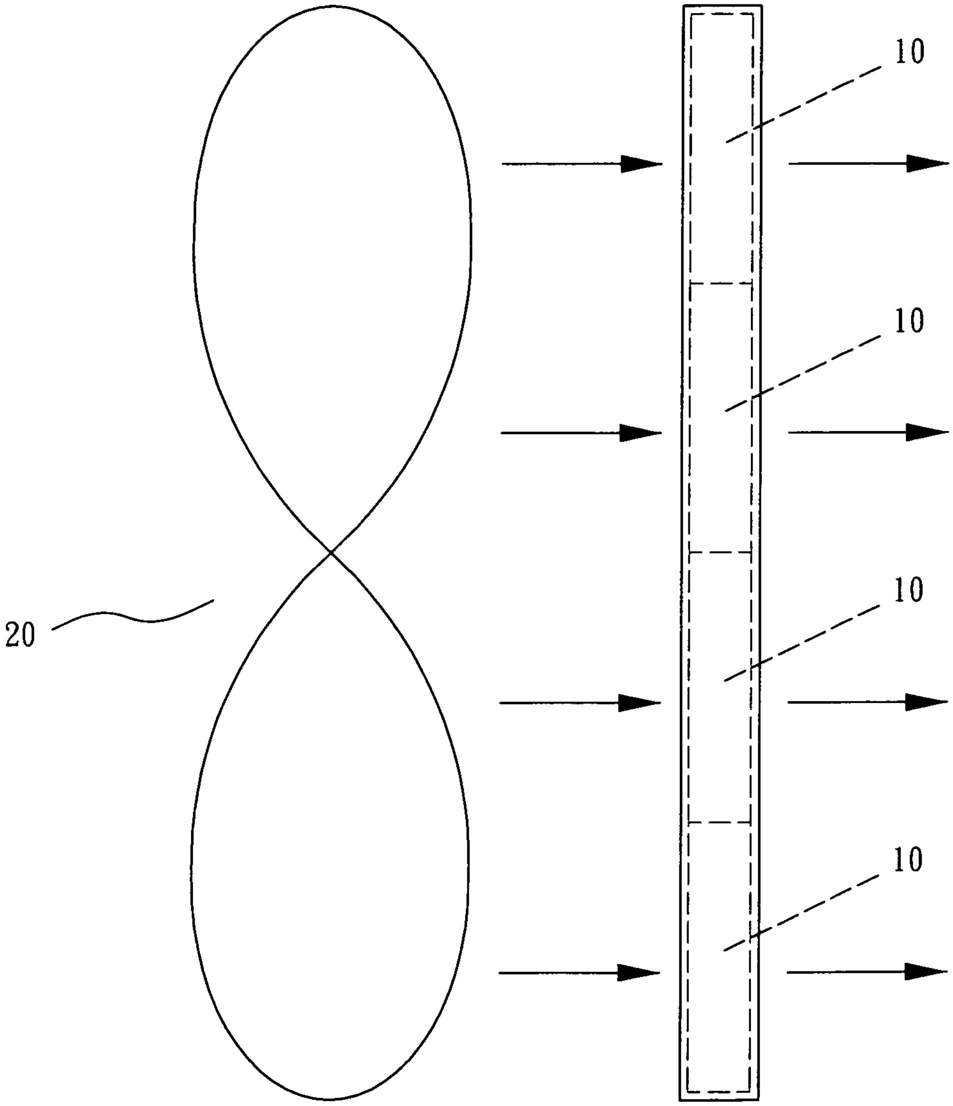
FIG. 3 is a schematic view of an application of a preferred embodiment of the present invention.

After the ceramic semiconductor 10 is electrically conducted and the oxide material capable of enhancing the space charge effect receives the current and heat, electrons are separated and remained in the through holes 11, and a dense electronic cloud is formed until electrons are accumulated to a certain number. In FIG. 3, a fan 20 installed outside the ceramic semiconductor 10 blows air to the ceramic semiconductor 10, and after the air passes through the through hole 11, oxygen in the air ($O_2$) may collide with the electrons separated from the ceramic semiconductor 10, and then the oxygen may combine with the electron so as to form a superoxide ion, such that after the ceramic semiconductor 10 is electrically conducted, heat is generated, and superoxide ions ($O_2+e \rightarrow O_2^-$ or $O_2+e \rightarrow O+O^-$) are discharged. After the ceramic semiconductor 10 is electrically conducted, the superoxide ions are discharged. Since the superoxide ion has a high chemical activity and features the sterilization, cell activation and wound healing functions, therefore the ceramic semiconductor 10 after being electrically conducted also has the functions of sterilization, cell activation and wound healing.

In addition, the present invention further comprises a fan 20 with a driving mechanism for driving the ceramic semiconductor 10 to move, so as to achieve the effect of passing air through the through hole 11 quickly. As a result, oxygen in the air ($O_2$) may collide with electrons (e) and then combine with each other to discharge superoxide ions continuously and quickly.

In summation of the description above, the present invention complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A ceramic semiconductor capable of increasing the density of surrounding superoxide ions after being heated, characterized in that an oxide material capable of enhancing a space charge effect is doped when the ceramic semiconductor is formed, and the ceramic semiconductor has at least one through hole, such that after the ceramic semiconductor is electrically conducted, current and heat are generated, and outer shell electrons of the ceramic semiconductor are separated and remained in the through hole, and accumulated to form an electron cloud in the through hole, and after air passes through the through hole, oxygen in the air collides with an electron and then they combine together to form a superoxide ion, such that the ceramic semiconductor can discharge the superoxide ion.

2. The ceramic semiconductor capable of increasing the density of surrounding superoxide ions after being heated according to claim 1, wherein the oxide material capable of enhancing the space charge effect is titanium dioxide ($TiO_2$).

3. The ceramic semiconductor capable of increasing the density of surrounding superoxide ions after being heated according to claim 1, wherein the oxide material capable of enhancing the space charge effect is zinc oxide (ZnO).

4. The ceramic semiconductor capable of increasing the density of surrounding superoxide ions after being heated according to claim 1, wherein the oxide material capable of enhancing the space charge effect is tungsten trioxide ($WO_3$).

5. The ceramic semiconductor capable of increasing the density of surrounding superoxide ions after being heated according to claim 1, wherein the oxide material capable of enhancing the space charge effect is ferric oxide ($Fe_2O_3$).

6. The ceramic semiconductor Capable of increasing the density of surrounding superoxide ions after being heated according to claim 1, wherein the oxide material capable of enhancing the space charge effect is strontium titanate ($SrTiO_3$).

7. The ceramic semiconductor capable of increasing the density of surrounding superoxide ions after being heated according to claim 1, wherein the through hole has a diameter Φ of 1 mm~2 mm.

8. The ceramic semiconductor capable of increasing the density of surrounding superoxide ions after being heated according to claims 1, further comprising a fan installed on an external side of the ceramic semiconductor and provided for blowing air to the through hole of the ceramic semiconductor.

9. The ceramic semiconductor capable of increasing the density of surrounding superoxide ions after being heated according to claims 1, wherein the ceramic semiconductor is driven to move by a driving mechanism.

* * * * *